(12) United States Patent
Hata et al.

(10) Patent No.: US 6,789,310 B1
(45) Date of Patent: Sep. 14, 2004

(54) COMPONENT MOUNTING APPARATUS

(75) Inventors: Kanji Hata, Katano (JP); Noriaki Yoshida, Ikeda (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/010,490

(22) Filed: Jan. 21, 1998

Related U.S. Application Data

(63) Continuation of application No. 08/740,992, filed on Nov. 5, 1996, now Pat. No. 5,778,525.

(30) Foreign Application Priority Data

Nov. 6, 1995 (JP) .............................................. 7-286969

(51) Int. Cl.[7] .............................................. B23P 19/00
(52) U.S. Cl. ............................. 29/740; 29/720; 29/739; 29/741; 29/743; 29/833; 29/834
(58) Field of Search ........................ 29/726, 739, 740, 29/741, 743, 833, 834, 836

(56) References Cited

U.S. PATENT DOCUMENTS

| | | | |
|---|---|---|---|
| 4,480,780 A | | 11/1984 | Claeskens et al. |
| 4,573,262 A | | 3/1986 | Dornes et al. |
| 4,624,050 A | | 11/1986 | Hawkswell |
| 4,631,812 A | | 12/1986 | Young |
| 4,875,285 A | | 10/1989 | Haan et al. ..................... 29/832 |
| 5,002,448 A | * | 3/1991 | Kamijima et al. ............. 29/739 |
| 5,115,559 A | * | 5/1992 | Oyama ......................... 29/720 |
| 5,191,702 A | | 3/1993 | Goedecke et al. |
| 5,323,528 A | * | 6/1994 | Baker ........................... 29/721 |
| 5,410,801 A | | 5/1995 | Shiloh et al. |
| 5,456,001 A | * | 10/1995 | Mori et al. ..................... 29/739 |
| 5,541,834 A | * | 7/1996 | Tomigashi et al. ............. 29/739 |
| 5,711,065 A | * | 1/1998 | Asai et al. ..................... 29/740 |
| 5,740,604 A | * | 4/1998 | Kitamura et al. ............. 29/832 |
| 5,741,114 A | * | 4/1998 | Onodera ..................... 414/783 |

FOREIGN PATENT DOCUMENTS

| | | | |
|---|---|---|---|
| EP | 0 453 369 | 10/1991 | |
| JP | 63-178596 | 7/1988 | |
| JP | 1-187898 | 7/1989 | |
| JP | 2-54999 | 2/1990 | |
| JP | 403030499 | * 2/1991 | .................. 29/740 |
| JP | 03-203294 | 9/1991 | |
| RU | 1829131 | 7/1993 | |
| WO | 85/03404 | 8/1985 | |

* cited by examiner

Primary Examiner—A. Dexter Tugbang
Assistant Examiner—Paul Kim
(74) Attorney, Agent, or Firm—Wenderoth, Lind & Ponack L.L.P.

(57) ABSTRACT

There is provided a plurality of component mounting apparatuses for sucking a plurality of components by a mounting head section and successively mounting the components onto a board located at a board positioning section. The component mounting apparatuses are arranged in parallel to one another, and a board transfer path is provided so that it penetrates the component mounting apparatuses. Even when the number of components to be mounted onto the board increases, the components are mounted on the component supply tables of the component mounting apparatuses as distributed thereto, and therefore, the whole apparatus is not dimensionally increased. The component supply tables are fixedly installed so as to become free of vibration, and the mounting head section executes the suction and the mounting of the plurality of components. Therefore, the component mounting operation speed can be remarkably increased.

21 Claims, 7 Drawing Sheets

COMPONENT MOUNTING APPARATUS

This is a continuation of application Ser. No. 08/740,992, filed Nov. 5, 1996, now U.S. Pat. No. 5,778,525.

BACKGROUND OF THE INVENTION

The present invention relates to component mounting apparatus and method for automatically mounting a variety of components such as electronic components onto a printed circuit board or the like, and a component mounting equipment including the apparatuses.

Generally, in an electronic component mounting apparatus, a number of component supply means are mounted in parallel to one another on a component supply table. In a component mounting stage, the component supply means are successively positioned in a specified component supply position according to a sequence of mounting components while moving the component supply table in a direction in which the component supply means are arranged in parallel. Then, each of the components at the component supply means is taken out by suction by a mounting head section, and the components are transferred to a circuit board positioned in the circuit board positioning section to be subjected to a component mounting process.

This type of conventional component mounting apparatus will be described with reference to FIG. 6 showing a perspective view of it and FIG. 7 showing a schematic plan view of it. In FIG. 6, at the front of an apparatus body 1 is provided a board positioning section 4 for positioning a circuit board P supplied from a board supply means 2 in a mounting position, and the circuit board P mounted with the required components in the board positioning section 4 is discharged by a board discharge means 3. On the other hand, at the rear of the apparatus body 1 is provided a component supply section 7, and a rotary type mounting head section 8 is provided between the component supply section 7 and the aforementioned board positioning section 4 as shown in FIG. 7.

In the component supply section 7, two component supply tables 10 and 11 are laterally movably provided independently of each other on a guide rail 9. The component supply tables 10 and 11 are mounted with a number of component supply means 12 arranged in parallel to one another in a direction in which the component supply tables 10 and 11 move. There is illustrated generally a so-called parts cassette as the component supply means 12, and it will be simply described below. That is, electronic components of an identical type are stored and arranged at regular intervals on a carrier tape while being wound around a reel 13 as covered with a cover tape. By drawing out the carrier tape from the reel 13 to feed it at a pitch equal to the storage intervals of the components and taking up the cover tape, the electronic component located at the leading end is positioned in a component supply position A opposite to a component suction head 14 of the mounting head section 8.

Furthermore, as shown in FIG. 7, the mounting head section 8 is constructed by providing a plurality of component suction heads 14 at regular angular intervals on an identical circle of a rotary table (not shown) provided rotatably around a vertical axis. Each component suction head 14 is designed to suck a component by vacuum suction means. Upon intermittently rotating the rotary table, it is stopped in steps in the component supply position A and a component mounting position B in order to concurrently perform receiving of each component from the component supply means 12 and mounting of each component onto the circuit board P. While one component supply table 10 is supplying components, the other component supply table 11 that is retreating in a standby position performs changing of component supply means 12 and replenishing of components thereby achieving preparation so that the component mounting apparatus can be operated continously.

In recent years, there has been a growing trend in that the types of circuit boards P to be manufactured and the types of components to be mounted on the circuit boards P are increasing. In order to cope with the above, be one solution to be considered is to increase the number of component supply means 12 on be mounted to the component supply tables 10 and 11. However, in such a case, the component supply tables 10 and 11 are to be elongated sidewise in order to increase the number of component supply means 12. Consequently, the length of the entire component supply section 7 becomes very long, and this leads to a degraded space utilization efficiency, reducing the productivity per floor area.

A more important issue is that the component supply tables 10 and 11 are fed at a pitch in accordance with taking out the components by the mounting head section 8, and therefore, the following inconvenience occurs. That is, when the component supply tables 10 and 11 increase in weight due to the increase of their lengths, not only is a greater drive power required to move the component supply tables 10 and 11 but also the inertial force of the component supply tables 10 and 11 increases. Therefore, vibration in feeding the component supply tables 10 and 11 at a pitch significantly increases. Consequently, it is impossible to increase the component supply rate, or the component mounting operation speed.

SUMMARY OF THE INVENTION

Accordingly, it is an object of the present invention to provide a component mounting apparatus and method capable of increasing the component mounting operation speed without dimensionally increasing the whole apparatus even when the types of boards and the number of components to be mounted on each board increase.

In accomplishing these and other objects, according to a first aspect of the present invention, there is provided a component mounting apparatus comprising:

a pair of component supply tables on which components are accommodated and which are arranged on both sides of a board mounting position where a board is positioned;

a first mounting head section for successively picking up the components at one of the component supply tables and thereafter successively mounting the picked-up components onto the board; and a second mounting head section for successively picking up the components at the other of the component supply tables and thereafter successively mounting the picked-up components onto the board, wherein the first and second mounting head sections are independently operated.

According to a second aspect of the present invention, there is provided the component mounting apparatus as described in the first aspect, wherein the first and second mounting head sections are controlled mutually in operation in accordance with a timing at which, when one of them carries out a component picking-up operation for picking up the components from the component supply table, the other of them carries out a component mounting operation for mounting the picked-up components onto the board.

According to a third aspect of the present invention, there is provided the component mounting apparatus as described in the first aspect, wherein one of the first and second mounting head section has component suction nozzles sucking the components at one time.

According to a fourth aspect of the present invention, there is provided the component mounting apparatus as described in the second aspect, wherein one of the first and second mounting head section has component suction nozzles sucking the components at one time.

According to a fifth aspect of the present invention, there is provided a component mounting equipment comprising:

a plurality of component mounting apparatuses each of which was described in the description of the first aspect, wherein a board transfer path along which the board is supplied to the board mounting position of the apparatus and discharged from the board mounting position of the apparatus by a board transfer device is provided so that the board transfer path connects the board mounting positions of the component mounting apparatuses, and the component supply tables of the component mounting apparatuses are arranged on both sides of the board mounting positions in the board transfer path.

According to a sixth aspect of the present invention, there is provided a component mounting equipment comprising:

a plurality of component mounting apparatuses each of which was described in the description of the second aspect, wherein a board transfer path along which the board is supplied to the board mounting position of the apparatus and discharged from the board mounting position of the apparatus by a board transfer device is provided so that the board transfer path connects the board mounting positions of the component mounting apparatuses, and the component supply tables of the component mounting apparatuses are arranged on both sides of the board mounting positions in the board transfer path.

According to a seventh aspect of the present invention, there is provided the component mounting equipment as described in the fifth aspect, wherein the components to be mounted onto the single board are all distributed into groups by type, and the components of the groups are accommodated in the component supply tables of the component mounting apparatuses as assigned thereto.

According to an eighth aspect of the present invention, there is provided the component mounting equipment as described in the sixth aspect, wherein the components to be mounted onto the single board are all distributed into groups by type, and the components of the groups are accommodated in the component supply tables of the component mounting apparatuses as assigned thereto.

According to a ninth aspect of the present invention, there is provided a component mounting method comprising steps of:

picking up by a first mounting head section components from one of a pair of component supply tables on which the components are accommodated and which are arranged on both sides of a board mounting position where a board is positioned, the first mounting head section successively picking up the components at one of the component supply tables;

thereafter successively mounting the components picked up by the first mounting head section onto the board;

picking up by a second mounting head section components from the other of the pair of component supply tables, the second mounting head section successively picking up the components at the other of the component supply tables; and thereafter successively mounting the components picked up by the second mounting head section onto the board, wherein the picking-up and mounting steps of the first mounting head section and the picking-up and mounting steps of the second mounting head section are independently carried out.

According to a tenth aspect of the present invention, there is provided the component mounting method as described in the ninth aspect, wherein the picking-up step of the first mounting head section and the mounting step of the second mounting head section are carried out at the same time, and the mounting step of the first mounting head section and the picking-up step of the second mounting head section are carried out at the same time.

According to an eleventh aspect of the present invention, there is provided the component mounting method as described in the ninth aspect, wherein in a component mounting equipment comprising a plurality of component mounting apparatuses each of which comprises the first and second mounting head sections and the pair of component supply tables between which a board transfer path along which the board is supplied to the board mounting position of the apparatus and discharged from the board mounting position of the apparatus by a board transfer device is provided so that the board transfer path connects the board mounting positions of the component mounting apparatuses, and the component supply tables of the component mounting apparatuses are arranged on both sides of the board mounting positions in the board transfer path, the picking-up and mounting steps of the first mounting head section and the picking-up and mounting steps of the second mounting head section are sequentially carried out.

According to a twelfth aspect of the present invention, there is provided the component mounting method as described in the eleventh aspect, wherein the picking-up step of each of the first mounting head sections and the mounting step of each of the corresponding second mounting head sections are carried out at the same time, and the mounting step of each of the first mounting head sections and the picking-up step of each of the corresponding second mounting head sections are carried out at the same time.

According to a thirteenth aspect of the present invention, there is provided the component mounting equipment as described in the eleventh aspect, wherein the components to be mounted onto the single board are all distributed into groups by type, and the components of the groups are accommodated in the component supply tables of the component mounting apparatuses as assigned thereto.

According to a fourteenth aspect of the present invention, there is provided the component mounting equipment as described in the twelfth aspect, wherein the components to be mounted onto the single board are all distributed into groups by type, and the components of the groups are accommodated in the component supply tables of the component mounting apparatuses as assigned thereto.

With the above arrangement, the component supply table is installed fixedly, and therefore, it becomes free of vibration regardless of the number of mounted component supply means which can be mounted thereon. The mounting head section is a robot type which sucks a plurality of components from the component supply table at one time and thereafter successively mounts the components to specified portions of the board. Therefore, even when the number of components to be mounted on a board increases, the component mounting operation speed can be remarkably increased further than in the conventional apparatus in which the component supply table is fed at a pitch with respect to the rotary type mounting head section.

Furthermore, components can be mounted by the two of the first and second mounting head sections onto the board positioned in a single board mounting position, and therefore, the component mounting operation speed can be further increased.

With the above arrangement of the fifth and sixth aspects and the eleventh and twelfth aspects, by mounting different components on the component supply tables installed at each of the component mounting apparatuses, the component supply tables are inevitably arranged on both sides of the board transfer path along it even when the types and the number of components to be mounted onto the board increase. Therefore, the equipment does not dimensionally increase as a whole without expanding significantly in the direction of the board transfer path. Furthermore, the mounting head sections of the component mounting apparatuses operate at high speed and the component supply tables are fixedly installed, and therefore, the component mounting operation speed can be increased.

With the above arrangement of the thirteenth and fourteenth aspects, when the types of boards are increased, the equipment can cope with it only by replacing a specified one of the component supply tables installed at the respective component mounting apparatuses with a component supply table mounted with components of the required type.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE EMBODIMENTS

Figure 1:
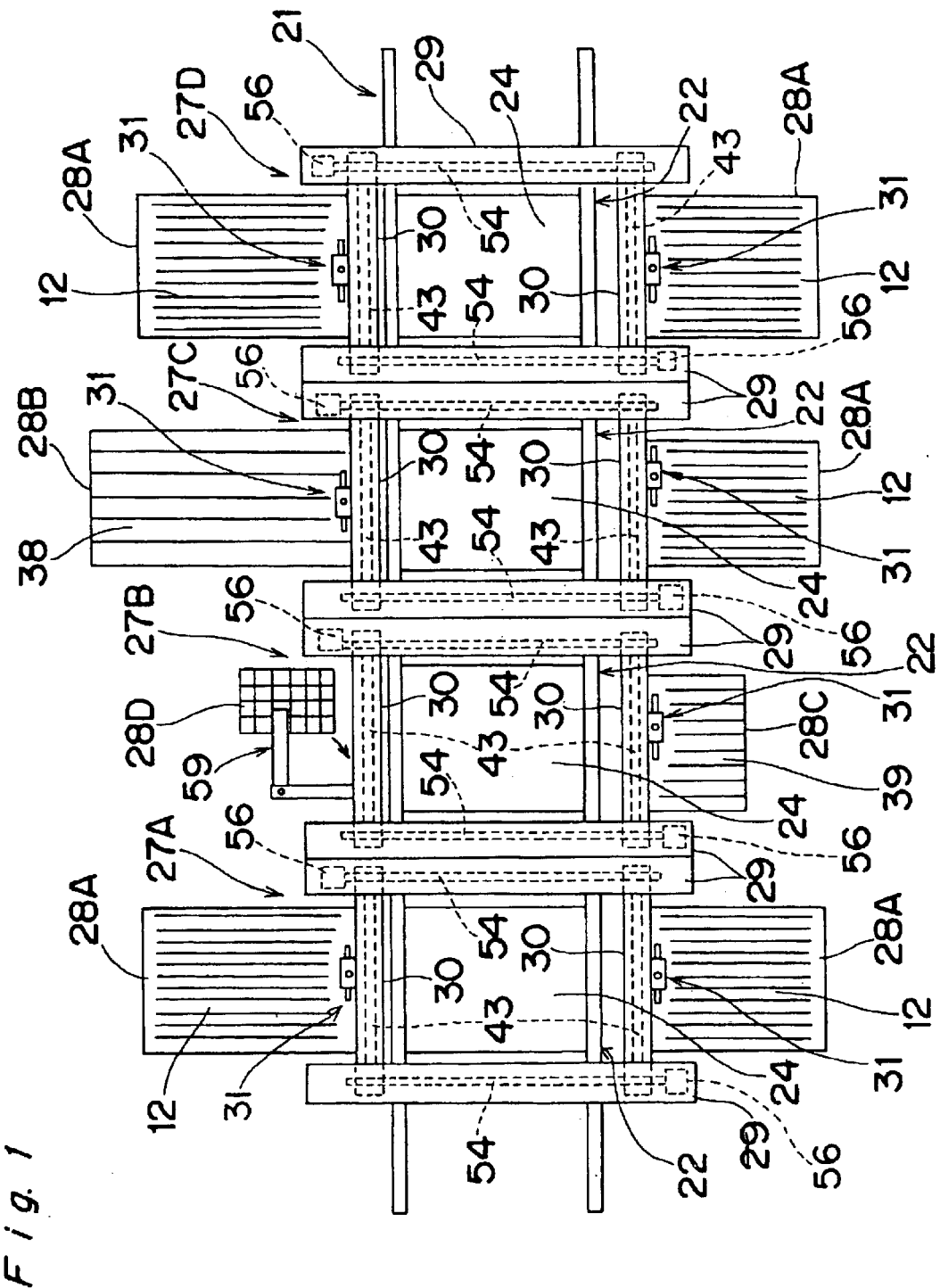
FIG. 1 is a schematic plan view schematically showing component mounting equipment according to an embodiment of the present invention.

Before the description of the present invention proceeds, it is to be noted that like parts are designated by like reference numerals throughout the accompanying drawings.

An embodiment of the present invention will be described below with reference to FIGS. 1 through 4.

FIG. 1 is a schematic plan view schematically showing component mounting equipment (component mounting line) according to an embodiment of the present invention. In the figure, four component mounting apparatuses 27A through 27D are provided along a board transfer path 21, and four board transfer means 22 are provided for the component mounting apparatuses 27A through 27D along the board transfer path 21 in the lateral direction so that each board transfer means 22 supplies a board to be mounted with components to a board mounting position of one of the component mounting apparatuses and discharges the board therefrom. The component mounting apparatuses 27A through 27D have an identical basic structure, and therefore, the component mounting apparatus 27D is taken as an example to be described below with reference to FIG. 2 that shows a perspective view of it and FIG. 3 that shows a plan view of its operating mechanism section.

Figure 2:
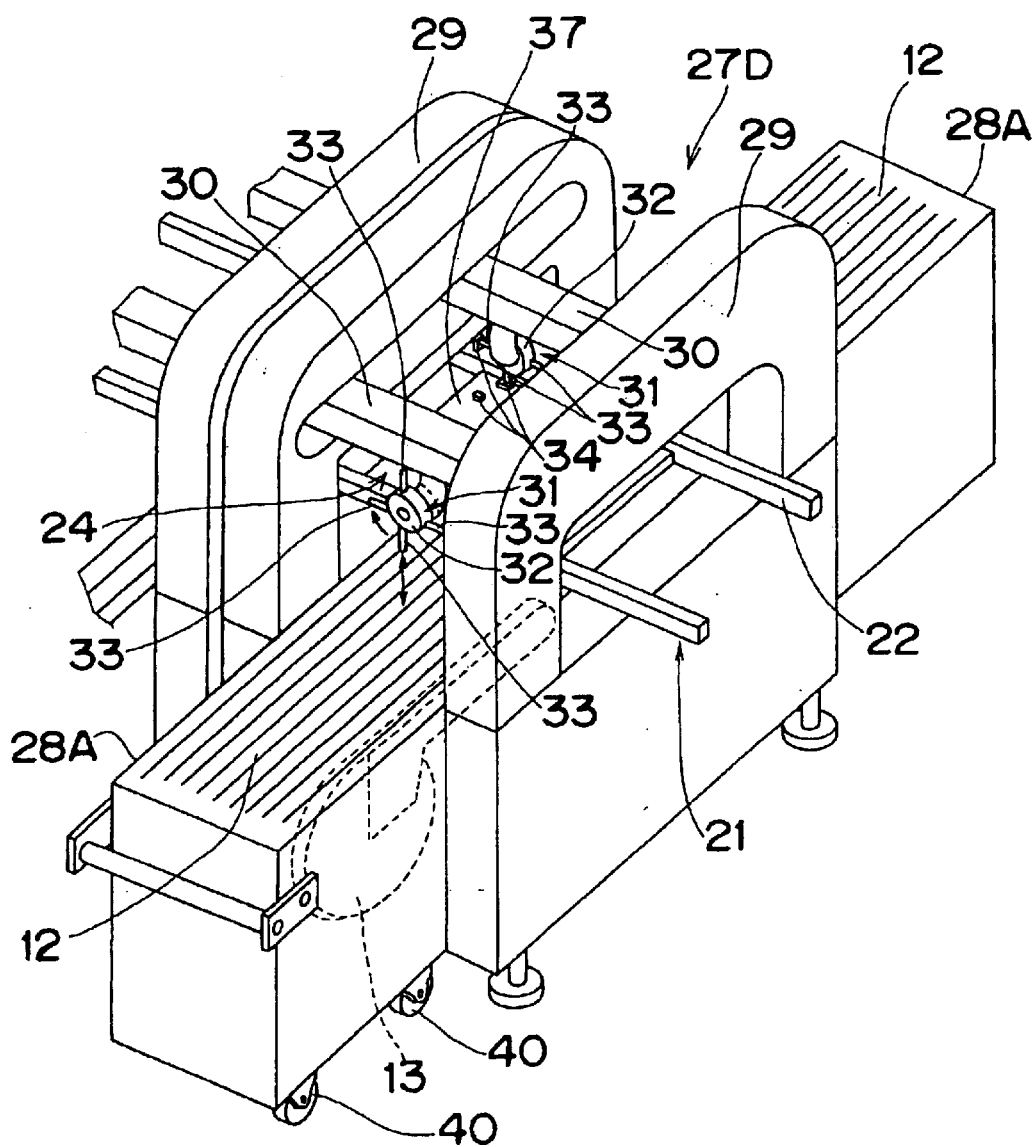
FIG. 2 is a perspective view of an embodiment of the component mounting apparatus of the present invention, the apparatus being a part of the above equipment.

In the component mounting apparatus 27D shown in FIG. 2, a laterally provided pair of inverted U-shaped support frames 29 are arranged in parallel to each other along the board transfer path 21 while allowing the board transfer path 21 to penetrate them. Between both the support frames 29 are arranged two operating frames 30 in parallel to each other across the frames 29. The operating frames are supported individually movably in a direction perpendicular to the board transfer path 21. To each operating frame 30 is mounted a mounting head section 31 movably along the operating frame 30. At the mounting head section 31, four component suction nozzles 33 are provided at regular intervals (at intervals of 90°) around a rotary member 32 that is rotatably supported around a horizontal axis. Upon rotating the rotary member 32 at a pitch equal to each interval of the component suction nozzles 33, the component suction nozzles 33 are selectively and sequentially directed downward to suck a component 34 from a component supply table 28A and mount the sucked component 34 onto a circuit board 37 located at the board mounting position where the board 37 is positioned by a board positioning section 24.

Between both the support frames 29 are inserted the component supply tables 28A from both depthwise sides as moved by casters 40, and thereafter they are fixedly installed in specified positions. The component supply table 28A is provided with component supply means 12 comprised of parts cassettes provided with the aforementioned reels 13. Other than this, as shown in FIG. 1, a component supply table 28B mounted with a stick-shaped component supply means 38 at which components stored in a pipe member are successively fed to a take-out position, a component supply table 28C on which bulk components 39 are placed, and a tray-shaped component supply table 28D are installed at the component mounting apparatuses 27A through 27D. It is to be noted that the tray-shaped component supply table 28D is provided with a mounting head section 59 having a pivot arm shape for taking out the components thereof.

Figure 3:
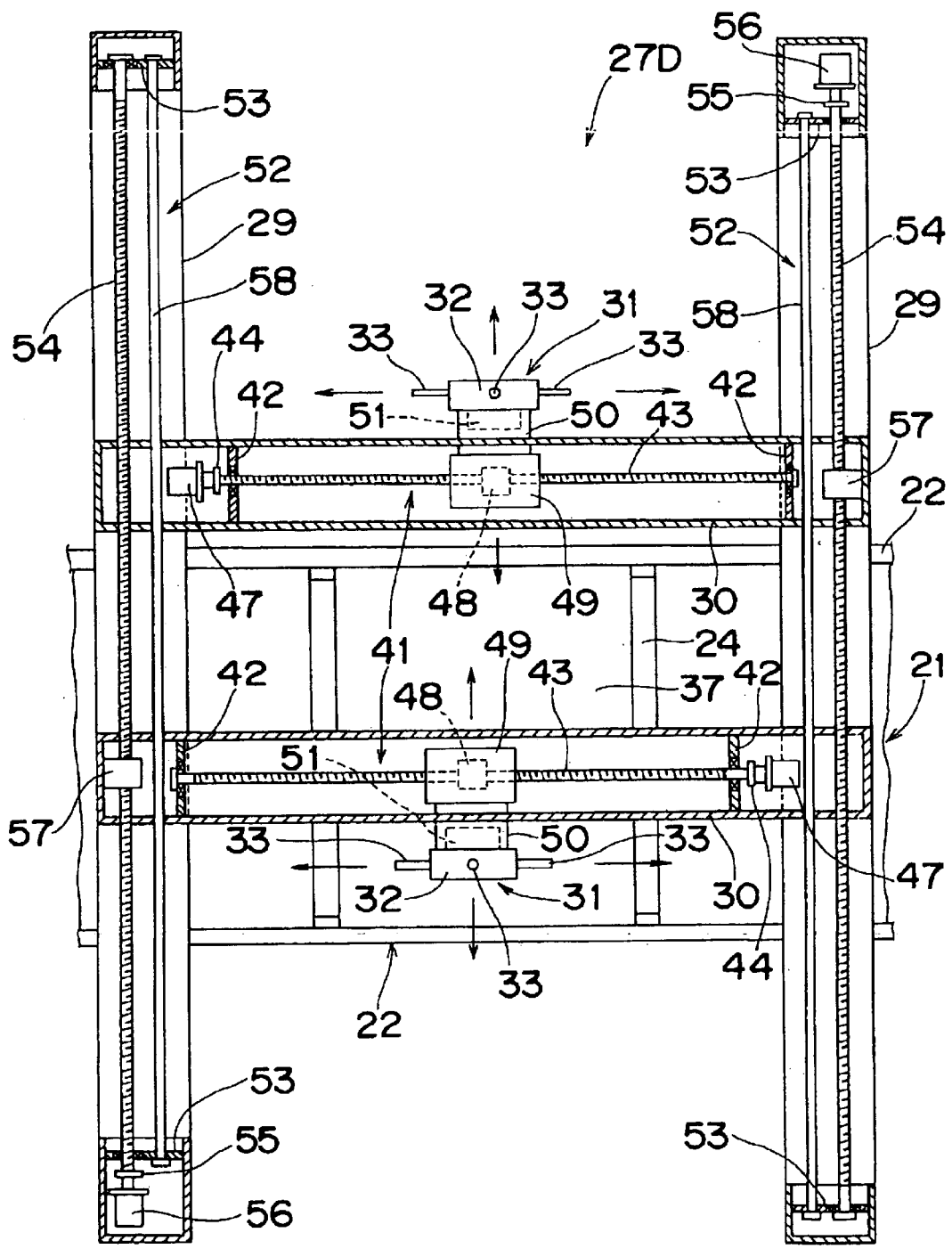
FIG. 3 is a plan view of an operating mechanism section of the above apparatus.

In FIG. 3, each operating frame 30 houses therein a head positioning mechanism section 41 for moving the mounting head section 31 in the lengthwise direction of the board transfer path 21.

The head positioning mechanism section 41 is comprised of a ball thread 43 that is rotatably supported across a pair of support plates 42 fixed to both ends of each operating frame 30, a step motor 47 for rotatively driving the ball thread 43 via a connecting means 44, and a moving member 49 in which a nut 48 meshed with the ball thread 43 is internally fixed and moved in accordance with the rotation of the ball thread 43. The mounting head section 31 is fixed to the moving member 49 via a head holder 50, and the head holder 50 is internally provided with a known head elevation mechanism section 51 for vertically moving the mounting head section 31.

Figure 5:
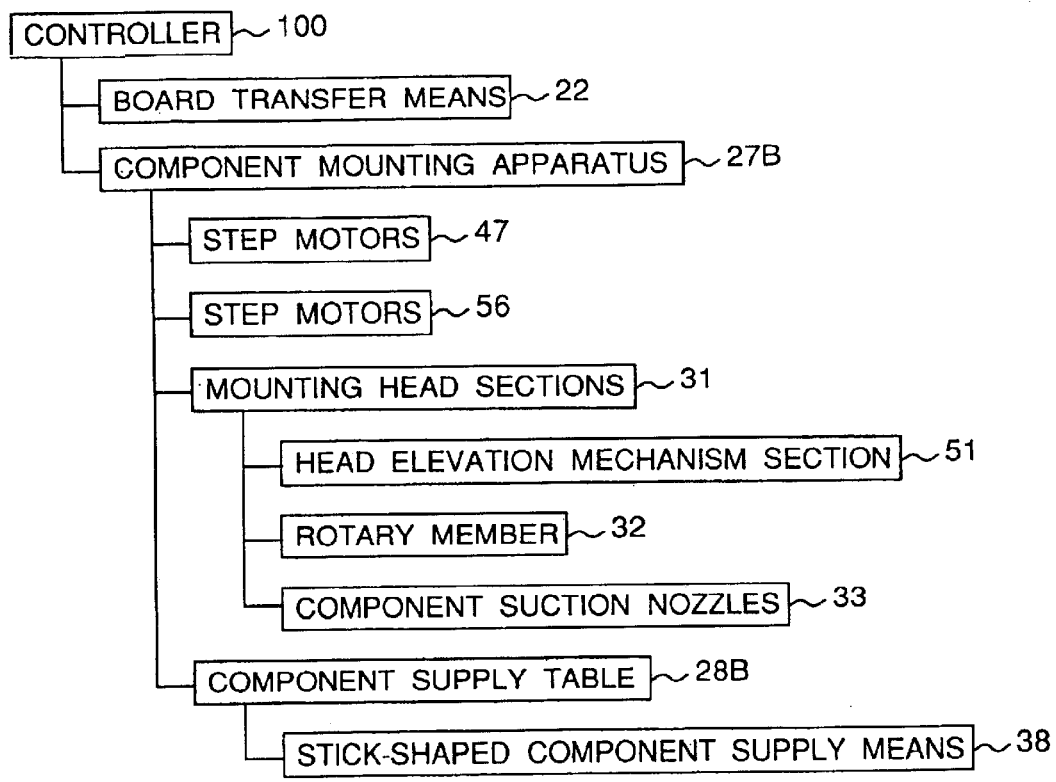
FIG. 5 is a block diagram showing construction for performing the control operation of the apparatus.
Figure 6:
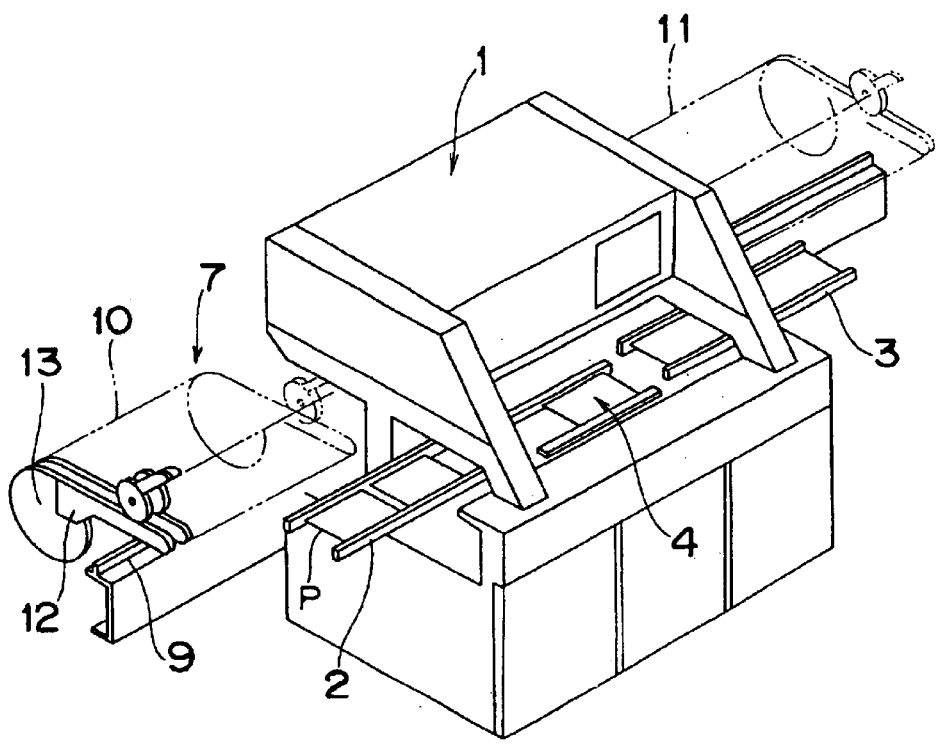
FIG. 6 is a perspective view of a conventional component mounting apparatus.
Figure 7:
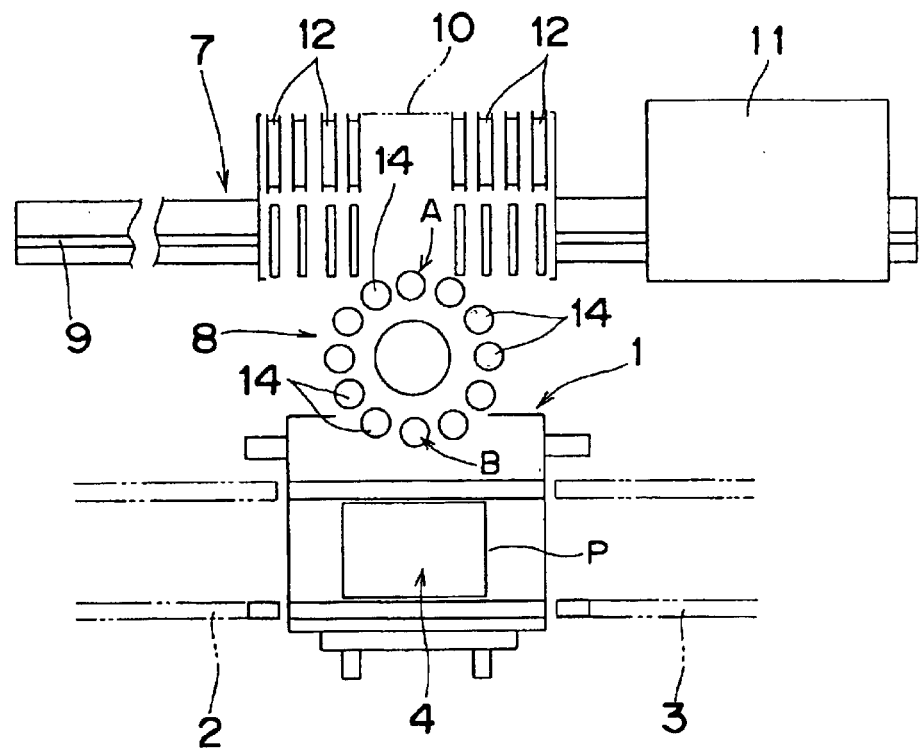
FIG. 7 is a schematic plan view of the above conventional apparatus.

Each of the support frames 29 houses therein a head feed mechanism section 52 for moving the head positioning mechanism section 41 via each operating frame 30 in a direction perpendicular to the board transfer path 21. The head feed mechanism section 52 is comprised of a ball thread 54 that is rotatably supported across a pair of support plates 53 fixed to both ends of each support frame 29, a step motor 56 for rotatively driving the ball thread 54 via a connecting means 55, a moving member 57 that is fixed to an end portion of each operating frame 30 as meshed with the ball thread 54 and operates to move the operating frame 30 in accordance with the rotation of the ball thread 54, and a guide shaft 58 that is fixed across the support plates 53 and operates to slidably support the operating frame 30 while allowing the guide shaft 58 to penetrate the other end of the operating frame 30. A controller 100 controls the operations of the apparatuses 27A–27D and the board transfer means 22, because it is connected to them as shown in FIG. 5 in which the connection structure of the apparatus 27B is shown as one example. The other connection structure of the apparatuses 27A, 27C, and 27D are similar to the apparatus 27B.

Figure 4:
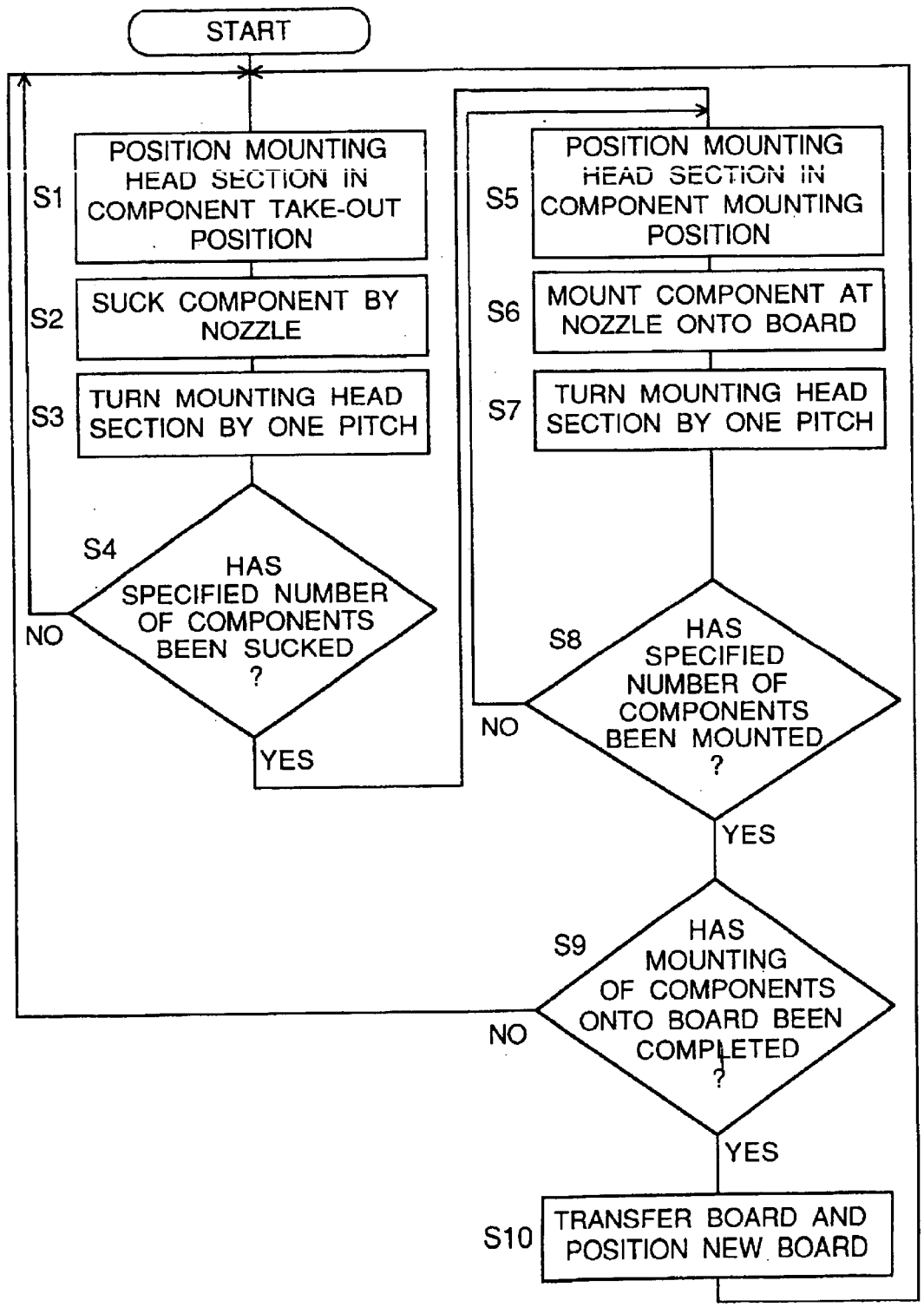
FIG. 4 is a flow chart of the above apparatus.

The operation of the aforementioned component mounting equipment will be described next with reference to a flowchart of FIG. 4. In the component mounting apparatuses 27A through 27D, the mounting head sections 31 are controlled in accordance with a timing at which, while one mounting head section 31 is sucking components 34 from one of the component supply tables 28A through 28D, the other mounting head section 31 mounts the components 34 onto the circuit board 37. Since both the mounting head sections 31 execute an identical operation except for an operating timing shift, only the operation of one mounting head section 31 will be now described.

First, the mounting head section 31 is moved to a position just above the component 34 to be sucked by suction on one of the component supply tables 28A through 28D and then positioned (step S1). That is, upon rotating the step motor 47 of the head positioning mechanism section 41 by a specified angle in the required rotational direction, the moving member 49 moves in the lengthwise direction of the board transfer path 21 by the ball thread 43 that is rotating integrally with the step motor 47, and the mounting head section 31 is moved to a specified component take-out position on the one of the component supply tables 28A through 28D. In this stage, in regard to the other component supply tables 28A through 28C except for the tray-shaped component supply table 28D, the component take-out position is positioned in a straight line extending along the board transfer path 21. Consequently, the mounting head section 31 does not move as positioned in the position until such components as the parts cassette or the stick fronting the mounting head section 31 deplete.

When the mounting head section 31 is positioned, the head elevation mechanism section 51 operates to move down the mounting head section 31, the component suction nozzle 33 sucks a component 34, and thereafter the mounting head section 31 is slightly moved up by the head elevation mechanism section 51 (step S2). Subsequently, the rotary member 32 of the mounting head section 31 is rotated by one pitch, and the next component suction nozzle 33 is made to front the component take-out position (step S3). In this stage, it is decided whether or not the mounting head section 31 has completed the suction of a specified number (four in this embodiment) of components 34 (step S4). If it has not been completed, the same operation as above will be repeated to suck the specified number of components 34.

When the suction of the specified number of components 34 has been completed, the step motor 56 of the head feed mechanism section 52 and the step motor 47 of the head positioning mechanism section 41 are simultaneously driven to move the mounting head section 31 onto the board positioning section 24 via the operating frame 30 in accordance with the rotation of the ball thread 54 and then position it just above a specified component mounting position of the circuit board 37 by the head positioning mechanism section 41 (step S5). Then, the head elevation mechanism section 51 is driven to mount the components that have been held by the component suction nozzle 33 as sucked thereto onto the circuit board 37 (step S6) After the mounting head section 31 is slightly moved up by the head elevation mechanism section 51, the mounting head section 31 is moved to a position just above the next component mounting position of the circuit board 37 and then positioned by the operations of the head positioning mechanism section 41 and the head feed mechanism section 52, and the rotary member 32 is rotated by one pitch, so that the component to be mounted next is made to front the component mounting position (step S7).

In this stage, it is decided whether or not the mounting of all the components 34 that have been held by the mounting head section 31 as sucked thereto has been completed (step S8). If it has not been completed, the same operation as above will be repeated to mount all the components 34 onto the specified positions of the circuit board 37.

When the specified number of components has been completed at step S8, it is decided whether or not the mounting of all the components 34 distributed to the component mounting apparatuses 27A through 27D for the circuit board 37 positioned in the board positioning section 24 has been completed (step S9). If it has not been completed, the mounting head sections 31 are moved again above the component supply tables 28A through 28D to repeat the suction of the components 34 from the component supply tables 28A through 28D and the mounting of the components 34 onto the circuit board 37 in a manner similar to the above until the mounting of all the components 34 onto the circuit board 37 is completed. When the mounting of all the components 34 onto the circuit board 37 is completed, each circuit board 37 positioned in the board transfer path 21 is fed by a specified pitch to be positioned in the board positioning sections 24 of the component mounting apparatuses 27A through 27D for the next process (step S10), and an operation similar to the above will be repeated.

In the above component mounting equipment, mutually different components can be mounted on the component supply tables 28A through 28D of the plurality (four in this embodiment) of component mounting apparatuses 27A through 27D provided in parallel to one another along the board transfer path 21. Therefore, when the types and the number of components 34 to be mounted onto the circuit board 37 increase, these components are mounted on the component supply tables 28A through 28D as distributed into groups classified by type. With this arrangement, since the component supply tables 28A through 28D are mounted with only the components 34 of the respective groups, the tables are not dimensionally increased. Furthermore, since the component supply tables 28A through 28D are installed perpendicularly to the board transfer path 21 at the component mounting apparatuses 27A through 27D, the equipment is not dimensionally increased as a whole without significantly expanding in the direction of the board transfer path 21.

Furthermore, since the mounting head section 31 of the component mounting apparatuses 27A through 27D only operates and the component supply tables 28A through 28D are fixedly installed, the tables become free of vibration regardless of the number of mounted component supply means 12 and 38. Furthermore, the mounting head section 31 sucks at one time a plurality of components 34 from the component supply tables 28A through 28D and successively mounts the components 34 onto the specified portions of the circuit board 37. Furthermore, the component mounting apparatuses 27A through 27D are each provided with a pair of mounting head sections 31 and controls the mounting head sections 31 so that, while one is sucking components 34, the components 34 that are held by the other as sucked thereto are mounted to the circuit board 37. With the above arrangement, even when the types and the number of components 34 to be mounted onto the circuit board 37 increase, the component mounting operation speed can be remarkably increased further than in the conventional apparatus in which the component supply table is fed at a pitch with respect to the rotary type mounting head section.

When the types of circuit boards 37 increase, it can be coped with only by replacing a part of the component supply tables 28A through 28D installed at the component mounting apparatuses 27A through 27D with component supply tables 28A through 28D mounted with required components 34. It is to be noted that the component mounting apparatuses 27A through 27D can be also used singly.

According to the present invention as described above, there is provided a robot type mounting head section in which the component supply tables are installed fixedly, and a plurality of components are sucked at one time from the component supply tables and thereafter transferred to be successively mounted onto the specified portions of the board. With this arrangement, even when the number of components to be mounted onto the board increases, the component mounting operation speed can be remarkably increased further than in the conventional structure in which the component supply table is fed at a pitch with respect to the rotary type mounting head section. furthermore, since the laterally provided pair of first and second mounting head sections are mutually controlled in operation in accordance with a timing at which, when one is located on the component supply table, the other is located on the board positioning section. With this arrangement, components can be mounted onto a single board by a plurality of mounting head sections, and therefore, the component mounting operation speed can be further increased.

Furthermore, according to the component mounting equipment of the present invention, by mounting mutually different components onto the component supply tables of the component mounting apparatuses arranged in parallel to one another, even when the types and the number of components to be mounted onto the circuit board increase, the equipment is not dimensionally increased as a whole without significantly expanding in the direction of the board transfer path. Furthermore, the component mounting operation speed can be further increased. In this case, there may be provided the structure in which all the components to be mounted onto single board are distributed into groups by type and the components of each group are mounted on component supply tables as assigned to them installed at the respective component mounting apparatuses. With this arrangement, when the types of boards increase, it can be coped with only by replacing a part of the component supply tables of the component mounting apparatuses with component supply tables mounted with the required components.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting apparatus comprising:
   a pair of component supply tables for accommodating a plurality of components, said component supply tables being arranged on opposite sides of a board mounting position;
   a first mounting head section having a plurality of rotatably supported component suction nozzles, wherein the first head section can rotate the component suction nozzles for successively picking up the plural components at one of the component supply tables by suction, thereafter the first mounting head section can be moved to a board positioned at the board mounting position, and thereafter the plural picked-up components can be successively mounted onto the board while the first mounting head section is moved in first and second directions which are perpendicular to each other,
   wherein the first direction is perpendicular to a direction in which the board is transferred, and the second direction is located along the board transfer direction; and
   a second mounting head section having a plurality of rotatable component suction nozzles, wherein the second head section is capable of rotating the component suction nozzles for successively picking up the plural components at the other of the component supply tables by suction, thereafter the second mounting head section is capable of moving the component suction nozzles to the board positioned at the board mounting position, and thereafter the plural picked-up components can be successively mounted onto the board while the second mounting head moves in third and fourth directions which are perpendicular to each other,
   wherein the third direction is parallel to the first direction, and the fourth direction is parallel to the second direction but is not necessarily the same as the second direction,
   wherein each of the first and second mounting head sections is independently moveable between the component supply table and the board, and the first mounting head section is capable of mounting the plural picked-up components onto the board while the second mounting head section successively sucks to pick up the plural components at the other of the component supply tables.

2. The component mounting apparatus as claimed in claim 1, wherein said each of said first and second mounting head sections is moveable in two directions which are perpendicular to each other and are parallel to a surface of the board.

3. The component mounting apparatus as claimed in claim 2, further comprising a controller for mutually controlling the first and second mounting head sections in accordance with a timing at which, when one of the first and second mounting head sections carries out a component picking-up operation for picking-up the components from the component supply table, the other of the first and second mounting head sections carries out a component mounting operation for mounting the picked-up components onto the board.

4. The component mounting apparatus as claimed in claim 3, wherein one of the first and second mounting head sections has a plurality of component suction nozzles for sucking the components at one time.

5. The component mounting apparatus as claimed in claim 2, wherein one of the first and second mounting head sections has a plurality of component suction nozzles for sucking the components at one time.

6. The component mounting apparatus as claimed in claim 1, further comprising a controller for mutually controlling the first and second mounting head sections in accordance with a timing at which, when one of the first and second mounting head sections carries out a component picking-up operation for picking-up the components from the component supply table, the other of the first and second mounting head sections carries out a component mounting operation for mounting the picked-up components onto the board.

7. The component mounting apparatus as claimed in claim 6, wherein one of the first and second mounting head sections has a plurality of component suction nozzles for sucking the components at one time.

8. A component mounting apparatus according to claim 1, further comprising a board positioning section for positioning the board such that the board is not moved during the mounting of the components.

9. A component mounting apparatus according to claim 1, wherein said component supply tables accommodate different kinds of components.

10. A component mounting apparatus according to claim 1, wherein at least one of said component supply tables is capable of continuously supplying the components.

11. The component mounting apparatus as claimed in claim 1, wherein the first head section includes a first rotary member that is rotatable about a horizontal axis, and the component suction nozzles are mounted on the first rotary member so that each of the component suction nozzles can be selectively and sequentially directed downward to suck a component from one of the component supply tables and mount the sucked components onto the board.

12. A component mounting apparatus comprising:

a pair of component supply tables for accommodating a plurality of components, said component supply tables being arranged on opposite sides of a board mounting position;

a first mounting head section for successively picking up the plural components at one of the component supply tables and thereafter successively mounting the plural picked-up components onto a board, positioned at the board mounting position, while moving in first and second directions which are perpendicular to each other, wherein the first direction is perpendicular to a direction in which the board is transferred, and the second direction is located along the board transfer direction; and a second mounting head section for successively picking up the plural components at the other of the component supply tables and thereafter successively mounting the plural picked-up components onto the board, positioned at the board mounting position, while moving in third and fourth directions which are perpendicular to each other, wherein the third direction is parallel to the first direction, and the fourth direction is parallel to the second direction but is not necessarily the same as the second direction, wherein each of the first and second mounting head sections is independently movable between one of the component supply tables and the board, wherein each of the first and second mounting head sections has a plurality of rotatably supported component suction nozzles capable of sucking more than one of the plurality of components prior to a component mounting operation, and each of the mounting head sections is capable of rotating the component suction nozzles, wherein the first mounting head section is capable of mounting the plural picked-up components onto the board while the second mounting head section successively sucks to pick up more than one of the plurality of components at the other of the component supply tables.

13. A component mounting apparatus according to claim 12, wherein said component supply tables accommodate different kinds of components.

14. A component mounting apparatus according to claim 1, wherein at least one of said component supply tables is capable of continuously supplying the components.

15. The component mounting apparatus as claimed in claim 12, wherein the first head section includes a first rotary member which is rotatable about a horizontal axis, and the component suction nozzles are mounted on the first rotary member so that each of the component suction nozzles can be selectively and sequentially directed downward to suck a component from one of the component supply tables and mount the sucked components on the board.

16. A component mounting apparatus comprising:

a pair of component supply tables for accommodating a plurality of components, said component supply tables being arranged on opposite sides of a board mounting position;

a first mounting head section having a plurality of nozzles that are rotatably supported for successively picking up more than one of the components at one of the component supply tables and thereafter successively mounting the picked-up components on a board that is positioned at the board mounting position, said first mounting head section being movable in first and second directions which are perpendicular to each other, wherein the first direction is perpendicular to a direction in which the board is transferred, and the second direction is along the direction in which the board is transferred; and a second mounting head section having a plurality of component suction nozzles that are rotatably mounted for successively picking up more than one of the components at the other of the component supply tables and thereafter successively mounting the picked-up components on the board, positioned at the board mounting position, while the second mounting head section moves in third and fourth directions which are perpendicular to each other, wherein the third direction is perpendicular to a direction in which the board is transferred, and the fourth direction is along the direction in which the board is transferred;

wherein each of the first and second mounting head sections is independently movable between the component supply tables and the board, wherein the first mounting head section is capable of mounting the plural picked-up components on the board while the second mounting head section successively picks up the plural components at the other of the component supply tables.

17. A component mounting apparatus according to claim 16, further comprising a board positioning section for positioning the board such that the board is not moved during mounting of the components.

18. A component mounting apparatus as according to claim 16, wherein each of said first and second mounting head sections includes a rotary member that is rotatable about a horizontal axis, wherein said plurality of component suction nozzles are positioned on said rotary member at regular intervals about the horizontal axis.

19. A component mounting apparatus according to claim 16, wherein said component supply tables accommodate different kinds of components.

20. A component mounting apparatus according to claim 16, wherein at least one of said component supply tables is capable of continuously supplying the components.

21. The component mounting apparatus as claimed in claim 16, wherein the first head section includes a first rotary member which is rotatable about a horizontal axis, and the component suction nozzles are mounted on the first rotary member so that each of the component suction nozzles can be selectively directed downward to suck a component from one of the component supply tables and mount the sucked components on the board.

* * * * *

UNITED STATES PATENT AND TRADEMARK OFFICE
CERTIFICATE OF CORRECTION

PATENT NO.    : 6,789,310 B1
DATED         : September 14, 2004
INVENTOR(S)   : Kanji Hata et al.

It is certified that error appears in the above-identified patent and that said Letters Patent is hereby corrected as shown below:

Column 9,
Line 46, replace Claim 1 with the following

1. A component mounting apparatus comprising:

first and second component supply tables for accommodating a plurality of components, said first and second component supply tables being arranged on both sides of a board transfer path;

a first rotary member having first nozzles, wherein said first rotary member is rotatable such that upon rotation of said first rotary member said first nozzles simultaneously rotate for successively picking up first components at said first component supply table by suction, thereafter said first rotary member can be moved to a board positioned at a board mounting position, and the picked-up first components can be successively mounted onto the board while said first rotary member is moved in first and second directions which are perpendicular to each other, with the first direction being perpendicular to the board transfer path, and the second direction being located along the board transfer path; and a second rotary member having second nozzles, wherein said second rotary member is rotatable such that upon rotation of said second rotary member said second nozzles simultaneously rotate for successively picking up second components at said second component supply table by suction, thereafter said second rotary member can move to the board positioned at the board mounting position, and the picked-up second components can be successively mounted onto the board while said second rotary member moves in third and fourth directions which are perpendicular to each other, with the third direction being parallel to the first direction, and the fourth direction being parallel to the second direction but not necessarily the same as the second direction, wherein each of said first and second rotary members is independently moveable between a respective one of said first and second component supply tables and the board when the board is at the board mounting position, and said first rotary member is capable of mounting picked-up components onto the board while said second rotary member successively sucks to pick up components at said second component supply table.

Column 10,
Line 23, replace Claim 2 with the following
2. The component mounting apparatus as claimed in claim 1, wherein the first, second, third and fourth directions are each in a plane that is parallel to the board transfer path.

UNITED STATES PATENT AND TRADEMARK OFFICE
CERTIFICATE OF CORRECTION

| | | |
|---|---|---|
| PATENT NO. | : 6,789,310 B1 | |
| DATED | : September 14, 2004 | |
| INVENTOR(S) | : Kanji Hata et al. | |

It is certified that error appears in the above-identified patent and that said Letters Patent is hereby corrected as shown below:

Column 10 (cont'd),
Line 28, replace Claim 3 with the following

3. The component mounting apparatus as claimed in claim 2, further comprising a controller for mutually controlling said first and second rotary members in accordance with a timing at which, when said first rotary member carries out a component picking-up operation for picking-up components from said first component supply table, said second rotary member carries out a component mounting operation for mounting picked-up components onto the board when the board is at the board mounting position.

Line 37, replace Claim 4 with the following

4. The component mounting apparatus as claimed in claim 1, further comprising a controller for mutually controlling said first and second rotary members in accordance with a timing at which, when said first rotary member carries out a component picking-up operation for picking-up components from said first component supply table, said second rotary member carries out a component mounting operation for mounting picked-up components onto the board when the board is at the board mounting position.

Line 40, replace Claim 5 with the following
5. The component mounting apparatus according to claim 1, further comprising a board positioning section for positioning the board at the board mounting position such that the board is not moved during mounting of components thereon via said first and second rotary members.

Line 44, replace Claim 6 with the following
6. The component mounting apparatus according to claim 1, wherein said first and second component supply tables are to accommodate different kinds of components.

Line 53, replace Claim 7 with the following
7. The component mounting apparatus according to claim 1, wherein at least one of said first and second component supply tables is capable of continuously supplying components.

UNITED STATES PATENT AND TRADEMARK OFFICE
CERTIFICATE OF CORRECTION

PATENT NO. : 6,789,310 B1
DATED : September 14, 2004
INVENTOR(S) : Kanji Hata et al.

It is certified that error appears in the above-identified patent and that said Letters Patent is hereby corrected as shown below:

Column 10 (cont'd),
Line 57, replace Claim 8 with the following

8.      The component mounting apparatus as claimed in claim 1, wherein said first rotary member is rotatable about a horizontal axis, and said first nozzles are mounted on said first rotary member so that each of said first nozzles can be selectively and sequentially directed downwardly to suck a component from said first component supply table and mount the sucked component onto the board when the board is at the board mounting position.

Line 60, replace Claim 9 with the following

9.      A component mounting apparatus comprising:

first and second component supply tables for accommodating a plurality of components, said first and second component supply tables being arranged on opposite sides of a board mounting position, wherein a board transfer path along which a board is transferred extends between said first and second component supply tables;

a first rotary member having first nozzles, wherein said first rotary member is rotatable such that upon rotation of said first rotary member said first nozzles simultaneously rotate for successively picking up first components at said first component supply table and thereafter successively mounting the plural picked-up first components onto a board, positioned at the board mounting position, while moving in first and second directions which are perpendicular to each other, with the first direction being perpendicular to the board transfer path, and the second direction being located along the board transfer path; and a second rotary member having second nozzles, wherein said second rotary member is rotatable such that upon rotation of said second rotary member said second nozzles simultaneously rotate for successively picking up second components at said second component supply table and thereafter successively mounting the picked-up second components onto the board, positioned at the board mounting position, while moving in third and fourth directions which are perpendicular to each other, with the third direction being parallel to the first direction, and the fourth direction being parallel to the second direction but not necessarily the same as the second direction, wherein each of said first and second rotary members is independently movable between a respective one of said first and second component supply tables and the board when the board is at the board mounting position, and

UNITED STATES PATENT AND TRADEMARK OFFICE
CERTIFICATE OF CORRECTION

PATENT NO. : 6,789,310 B1
DATED : September 14, 2004
INVENTOR(S) : Kanji Hata et al.

It is certified that error appears in the above-identified patent and that said Letters Patent is hereby corrected as shown below:

Column 10 (cont'd),
wherein said first rotary member is capable of mounting picked-up components onto the board, at the board mounting position, while said second rotary member successively picks up components, via said second nozzles, at said second component supply table.

Line 63, replace Claim 10 with the following
10.     The component mounting apparatus according to claim 9, wherein said first and second component supply tables are to accommodate different kinds of components.

Line 66, replace Claim 11 with the following
11.     The component mounting apparatus according to claim 9, wherein at least one of said first and second component supply tables is capable of continuously supplying components.

Column 11,
Line 7, replace Claim 12 with the following
12.     The component mounting apparatus as claimed in claim 9, wherein said first rotary member is rotatable about a horizontal axis, and said first nozzles are mounted on said first rotary member so that each of said first nozzles can be selectively and sequentially directed downwardly to suck a component from said first component supply table and mount the sucked component onto the board when the board is at the board mounting position.

Line 52, replace Claim 13 with the following
13.     A component mounting apparatus comprising:
first and second component supply tables for accommodating a plurality of components, said component supply tables being arranged on both sides of a board transfer path;
a first rotary member having first nozzles, wherein said first rotary member is rotatable such that upon rotation of said first rotary member said first nozzles simultaneously rotate for successively picking up first components at said first component supply table and thereafter successively mounting the picked-up first components onto a board that is positioned at a board mounting position, said first rotary member being movable in first and second directions which are perpendicular to each other, with the first direction being perpendicular to the board transfer path, and the second direction being along the board transfer path; and

UNITED STATES PATENT AND TRADEMARK OFFICE
CERTIFICATE OF CORRECTION

PATENT NO. : 6,789,310 B1
DATED : September 14, 2004
INVENTOR(S) : Kanji Hata et al.

It is certified that error appears in the above-identified patent and that said Letters Patent is hereby corrected as shown below:

Column 11 (cont'd), a second rotary member having second nozzles, wherein said second rotary member is rotatable such that upon rotation of said second rotary member said second nozzles simultaneously rotate for successively picking up second components at said second component supply table and thereafter successively mounting the picked-up second components onto the board, positioned at the board mounting position, while said second rotary member moves in third and fourth directions which are perpendicular to each other, with the third direction being perpendicular to the board transfer path, and the fourth direction being along the board transfer path, wherein each of said first and second rotary members is independently movable between a respective one of said first and second component supply tables and the board when the board is at the board mounting position, and wherein said first rotary member is capable of mounting picked-up first components onto the board, at the board mounting position, while said second rotary member successively picks up components at said second component supply table.

Line 55, replace Claim 14 with the following

14. The component mounting apparatus according to claim 13, further comprising a board positioning section for positioning the board at the board mounting position such that the board is not moved during mounting of components thereon by said first and second rotary members.

Line 58, replace Claim 15 with the following

15. The component mounting apparatus as according to claim 13, wherein each of said first and second rotary members is rotatable about a horizontal axis, and wherein said first and second nozzles are positioned, respectively, on said first and second rotary members at regular intervals about the horizontal axis.

Column 12,
Line 1, replace Claim 16 with the following
16    The component mounting apparatus according to claim 13, wherein said first and second component supply tables are to accommodate different kinds of components.

Line 41, replace Claim 17 with the following
17.    The component mounting apparatus according to claim 13, wherein at least one of said first and second component supply tables is capable of continuously supplying components.

UNITED STATES PATENT AND TRADEMARK OFFICE
CERTIFICATE OF CORRECTION

PATENT NO.      : 6,789,310 B1
DATED           : September 14, 2004
INVENTOR(S)     : Kanji Hata et al.

It is certified that error appears in the above-identified patent and that said Letters Patent is hereby corrected as shown below:

Column 12 (cont'd),
Line 44, replace Claim 18 with the following

18.    The component mounting apparatus as claimed in claim 13, wherein said first rotary member is rotatable about a horizontal axis, and said first nozzles are mounted on said first rotary member so that each of said first nozzles can be selectively and sequentially directed downwardly to suck a component from said first component supply table and mount the sucked component onto the board when the board is at the board mounting position.

Signed and Sealed this

Fourth Day of October, 2005

JON W. DUDAS
*Director of the United States Patent and Trademark Office*